United States Patent [19]

Ando et al.

[11] Patent Number: 4,931,961
[45] Date of Patent: Jun. 5, 1990

[54] CHIP TYPE CAPACITOR AND MANUFACTURE THEREOF

[75] Inventors: Susumu Ando; Ikuo Hagiwara, both of Tokyo, Japan

[73] Assignee: Nippon Chemi-Con Corporation, Tokyo, Japan

[21] Appl. No.: 332,784

[22] Filed: Mar. 7, 1989

[30] Foreign Application Priority Data

| Mar. 7, 1988 | [JP] | Japan | 63-54599 |
| Jun. 29, 1988 | [JP] | Japan | 63-161431 |
| Aug. 11, 1988 | [JP] | Japan | 63-200383 |
| Nov. 7, 1988 | [JP] | Japan | 63-280864 |

[51] Int. Cl.$^5$ .......................... H01G 9/24; H05K 1/18
[52] U.S. Cl. ................................. 361/535; 361/400; 29/25.03
[58] Field of Search .............. 29/570.1; 361/534–540, 361/511, 520, 400, 402, 403, 404

[56] References Cited

U.S. PATENT DOCUMENTS

| 3,474,300 | 10/1969 | Pearce et al. | 361/520 |
| 3,806,766 | 4/1974 | Fanning | 361/400 |
| 3,955,124 | 5/1976 | Jones | 361/400 |
| 4,483,062 | 11/1984 | Irikura | 29/570.1 |
| 4,818,823 | 4/1989 | Bradley | 361/400 X |

Primary Examiner—Donald A. Griffin
Attorney, Agent, or Firm—Young & Thompson

[57] ABSTRACT

There is disclosed a chip type capacitor in which the capacitor is accommodated in a sheathing frame having the receiving space compatible with an external size of the capacitor, terminals derived from the same open end of the capacitor are bent along the open end and the top surface of the sheathing frame and a solderable metal layer is arranged in a part of the top surface thereof.

10 Claims, 4 Drawing Sheets

4,931,961

CHIP TYPE CAPACITOR AND MANUFACTURE THEREOF

FIELD OF THE INVENTION

This invention relates to an improvement in a capacitor particularly a chip type capacitor suitable for mounting on a surface of the printed circuit board.

BACKGROUND OF THE INVENTION

Hitherto, the capacitor chipping has been realized such that a capacitor element is first accommodated in a sheathing case of a synthetic resin for subjecting to a resin mold processing and then the terminals derived from an end of the resin for an exterior connection are bent along the end of the resin to match with the wiring pattern of the printed circuit board.

Further, it has been proposed to accommodate the conventional capacitor in a sheathing frame for arrangement of the terminals in the same plane as the end of the sheathing frame as disclosed in the Japanese Utility Model Publication 59-3557. Furthermore, another proposal is to arrange a capacitor on a closed-end cylindrical sheathing frame for derivation of the terminals from a through-hole on the top surface of the sheathing frame and to bend the terminals in a concave section provided on the external surface of the sheathing frame as disclosed in the Japanese laid-open patent publication 60-245116 and the Japanese laid-open patent publication 60-24511.

These conventional chip type capacitors are amenable to a surface mounting without changing the ordinary structure of the capacitor.

SUMMARY OF THE INVENTION

However, in the conventional chip type capacitor with the mold processing, capacitor elements are likely to suffer heat deterioration due to thermal stress during the mold processing.

Moreover, in case a capacitor is received in a sheathing frame 2 from an end of which terminals 3, 3 are derived for connection into a printed circuit board 12 for preparing a chip type capacitor with a soldering 13, as shown in FIG. 9, only one end of the chip type capacitor is fixed to the printed circuit board 12, so that an opposite end thereof tends to separate upwardly from the surface of the printed circuit board owing to the soldering heat or the capacitor per se is peeled off the printed circuit board 12 by mechanical stress.

Furthermore, according to the latest miniaturization of the electronic parts, the distance between terminals derived from electronic parts becomes extremely short with a fine dimension. Moreover, the wiring pattern density of the printed circuit board is increased and efficient arrangement requires various distances between the terminals. Thus, it is required to hold terminals so as to cope with various distances between terminals by keeping a proper distance between terminals or a distance free of a short-circuit to be caused by soldering.

Further, a tip end of the terminal exposed to a top surface of the sheathing frame is liable to resume its original shape on account of warping caused by a so-called elasticity with a difficulty to hold a proper position and distance.

As another problem, when a capacitor is received in the sheathing frame made of heat-resistive resins and the like, a high speed molding of a micro sheathing frame encounters difficulty.

Further, in the process of accommodating the capacitor in the sheathing frame, the capacitor is received in the sheathing frame formed by a mold, so that individual sheathing frames are required for alignment by the parts feeder or the like. Thus, the accommodation process becomes complex with difficulty in acceleration of the speed of the manufacturing process and requirement of a high accuracy of the jig or the like for the accommodating operation. Besides, another means or process is required to avoid such inconvenience as a reverse-mounting of the capacitor and the like.

An object of the invention is to provide a chip type capacitor realizing a desirable mounting of the capacitor onto a printed circuit board without altering the structure of the conventional capacitor.

Another object of the invention is to manufacture a chip type capacitor more efficiently and at a higher speed than is conventional.

To achieve the foregoing objects, a chip type capacitor according to the invention is characterized in that a capacitor is accommodated in the sheathing frame having a receiving space compatible with an external size of the capacitor and that terminals are derived from the same plane of the capacitor for bending along an open end and a top surface of the sheathing frame, said top surface being partially provided with a metal layer susceptible to soldering.

The solderable metal layer may be provided at a part of the top surface of the sheathing frame, for example, by binding a solderable metal piece or coating with a conductive paste or it may be formed by evaporation or a non-electrolytic plating.

Further, to a predetermined end of the sheathing frame a solderable metal plate partially provided with extensions is fixed by burying the extensions thereonto.

Moreover, the extensions of the metal plate are buried in an open end of the sheathing frame for bending the metal plate along the top surface thereof.

Furthermore, upon manufacturing the chip type capacitor according to the invention, provision is made of a lead frame having a connection partially provided with extensions, said connection projecting from a strip substrate and extensions of the connection being buried in the top surface of the sheathing frame before the connection fixed to the sheathing frame is cut off from the lead frame of the strip substrate.

As a further alternative manufacturing process of the capacitor, the capacitor is accommodated in the receiving space of the sheathing frame formed in the connection of the lead frame before the sheathing frame is separated from the lead frame.

Other objects and advantages of the invention will be appreciated from the following description.

In FIG. 1, terminals 3, 3 derived from a capacitor 1 and a soldable metal layer 7 are arranged in a top surface 24 of the sheathing frame 2. When the chip type capacitor is substantially mounted on a printed circuit board, terminals 3, 3 and the metal chip 7 are respectively soldered so that opposite ends of the top surface of the chip type capacitor are seated and fixed on the printed circuit board.

In the manufacturing process according to the embodiment as shown in FIG. 5, the sheathing frame 2 is integrally formed with the connecting portion 18 of the lead frame 14 so that a collective unit of the sheathing frame 2 linked by the lead frame 14 is provided for enabling a continuous manufacture of the sheathing frame 2. Further, since the collective body of the sheathing frame 2 and the lead frame 14 may be supplied together to the next process, the directions of the sheathing frames 2 to be supplied as a collective unit may be consolidated.

Preferred embodiments of the chip type capacitor according to the invention and the manufacturing method thereof are described below in detail with reference to the accompanying drawings in which:

PREFERRED EMBODIMENTS OF THE INVENTION

Figure 1:
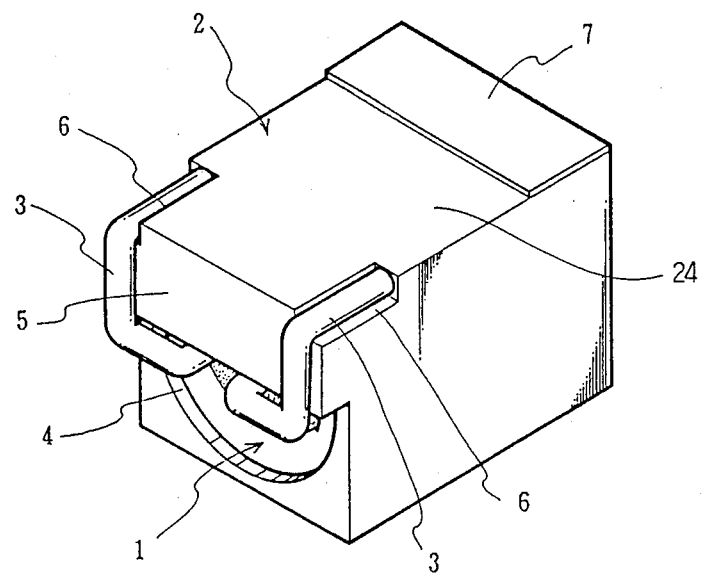
FIG. 1 is a perspective view showing one embodiment of the chip type capacitor according to the invention.

In FIG. 1, the capacitor body 1 is formed of a capacitor element of an electrode foil with an electrolytic paper wound together (not shown) and accommodated in a cylindrical sheathing frame having a closed and made of aluminum or the like and an open end of the sheathing frame is closed by a sealing member. Terminals 3, 3 derived from the capacitor element are led out through the sealing member.

The capacitor body 1 is received in the sheathing frame 2 having a cylindrical space 4 compatible with an external size and shape of the capacitor 1. The sheathing frame 2 is desirably formed of an excellent heat resistive material, preferably such heat resistive synthetic resins as epoxy, phenol, polyimide or ceramics and the like.

In this embodiment, the space 4 of the sheathing frame 2 is formed into a cylindrical shape of an internal size substantially the same as an external size of the capacitor 1. However, when the capacitor of non-cylindrical shape, for example, the capacitor having an ellipsoid section is used, the sheathing frame 2 having an elliptical cylindrical space 4 compatible with the configuration of the capacitor may preferably be used.

The terminals 3, 3 derived from an end of the capacitor 1 are bent along an opened end of the sheathing frame 2 and the top surface 24 for reception into grooves 6, 6 provided in the top surface 24 of the sheathing frame 2. In the top surface 24 of the sheathing frame 2 is previously arranged a metal piece 7 at a position not contacting the terminals 3, 3. The metal piece 7 may be arranged in the top surface 24 of the sheathing frame 2 by means of binding or mounting, notwithstanding in this embodiment a bonding agent is applied to a predetermined position before the metal piece 7 is bound thereto. Further, since the metal piece 7 when mounted on the printed circuit board is fixed by soldering, the solderable metals such as silver, tin, lead, zinc, nickel, iron, copper or alloys thereof may preferably be selected. Alternatively, a metal tape in which a bonding agent is applied to one side of a solderable thin metal piece may preferably be employed.

The open end of the sheathing frame 2 is provided with a protuberance 5 for covering a part of the open end in contact with a terminal face of the capacitor 1 accommodated in the receiving space 4 of the sheathing frame 2. Consequently, the capacitor body 1 is fixed in the sheathing frame 2 by the protuberance 5 and the bent terminals 3, 3.

In this embodiment, in the top surface 24 of the sheathing frame 2 are arranged the terminals 3, 3 derived from the capacitor body 1 and the previously bound metal piece 7. When the chip type capacitor according to this embodiment is actually mounted on the printed circuit board, opposite ends of the chip type capacitor are fixed on the printed circuit board by soldering the terminals 3, 3 and the metal piece 7 respectively.

Figure 2:
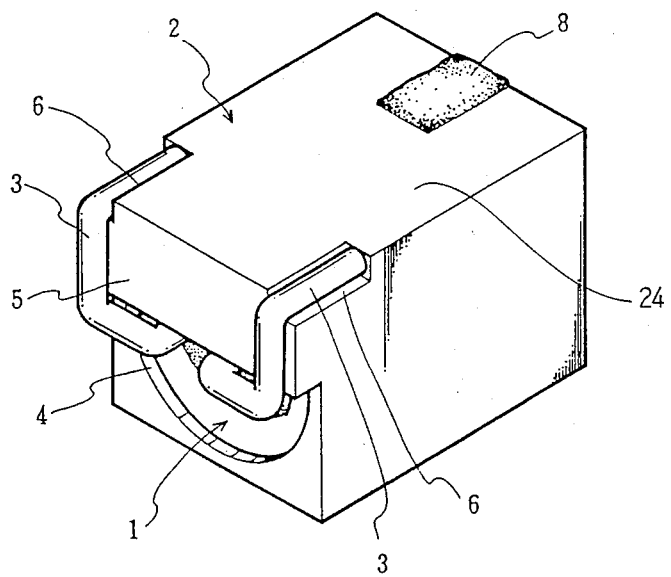
FIG. 2 is a perspective view showing another embodiment of the chip type capacitor according to the invention.

In FIG. 2, the second embodiment according to the invention is shown, in which the capacitor body 1 is provided with the terminals 3, 3 derived from an end of the sealing member like the first embodiment. The sheathing frame 2 is provided with the receiving space 4 to accommodate the capacitor body as well as the protuberance 5 to cover a part of the open end as in the first embodiment. The terminals 3, 3 are bent along an end of the capacitor 1 and the top surface of the sheathing frame 2 for exposure on the top surface 24 of the sheathing frame 2 to which a conductive paste 8 is applied.

The conductive paste 8 may preferably be prepared by mixing a metal powder of solderable metals such as silver, tin, lead, zinc, nickel, iron, copper and the like or their mixture or alloy into synthetic resins which may preferably be thermosetting synthetic resins of excellent heat-resistive properties, such as epoxy, phenal, di-acryl phthalate, unsaturated polyesters, polyimide, polyamide bismaleimide and the like.

The chip type capacitor according to this embodiment is actually mounted on the printed circuit board like the first embodiment before terminals 3, 3 and the conductive paste 8 are respectively soldered.

In this embodiment, the solderable metal layer may be formed on the top surface 24 of the sheathing frame 2 by merely applying the conductive paste 8 to the top surface 24 of the sheathing frame 2 with a convenient forming process of the metal layer but free of any heat fluctuation, or peeling-off of the bonding agent to be caused by the soldering heat of the soldering process as in the first embodiment.

Moreover, since a thinner metal layer may be formed as compared with the first embodiment wherein the metal piece 7 is bound, the chip type capacitor may be stably mounted on the printed circuit board.

Figure 3:
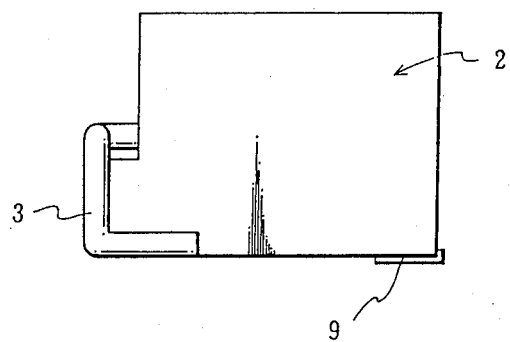
FIG. 3 is a side view showing a further embodiment of the chip type capacitor according to the invention.

Furthermore, the third embodiment according to the invention is shown in FIG. 3. In this embodiment, as in the first and second embodiments, the capacitor body 1 having the terminals 3, 3 protruding from the end thereof is accommodated in the sheathing frame 2 and the terminals 3, 3 are bent along the open end of the sheathing frame 2 and the top surface of the body.

The sheathing frame 2 from its top surface to the open end is partially provided with a metal layer 9 of solderable metal such as silver, tin, zinc, nickel, iron, copper or the like by means of an evaporation or a non-electrolytic plating at a position not contacting the terminals 3, 3.

Since the chip type capacitor according to this embodiment dispenses with the processes of binding the metal piece 7 with bonding agents or coating the conductive paste 8 of synthetic resin mixed with metal as in the second embodiment, the metal layer 9 may be formed in the sheathing frame 2 without consideration of the heat-resistive properties of the bonding agent and the synthetic resins with an enhanced reliability.

Figure 4:
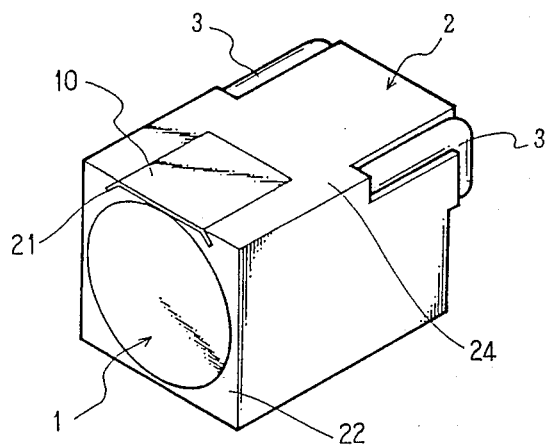
FIG. 4 is a perspective view showing still a further embodiment of the chip type capacitor according to the invention.
Figure 5:
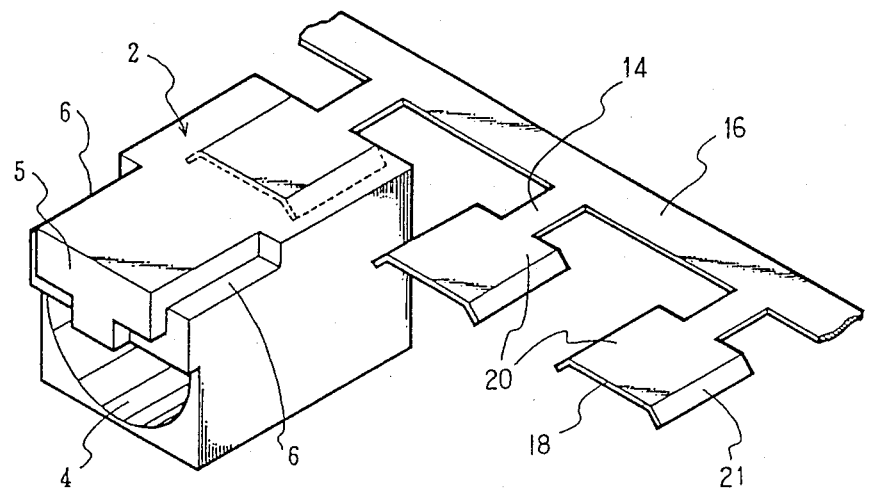
FIG. 5 is a perspective view of the manufacturing process descriptive of the chip type capacitor as shown in FIG. 4.

In FIGS. 4 and 5, the sheathing frame 2 is formed with the receiving space 4 for reception of the capacitor body 1 and one open end thereof is provided with a projection 5 to cover a part of the open end.

As shown in FIG. 4, the capacitor 1 is received in the receiving space 4 of the sheathing frame 2 and the terminals 3, 3 of the capacitor 1 are bent along a projection 5 and the top surface 24 of the sheathing frame 2.

To the top surface 24 in the vicinity of an opposite open end 23 confronting the open end formed with the projection 5 of the sheathing frame 2 is provided a metal plate 10 having extensions 21, 21 buried in the sheathing frame 2. The metal plate 10 may preferably be formed of solderable metals such as silver, tin, lead, zinc, nickel, iron, copper or their alloy and the like.

In the chip type capacitor according to this embodiment, the top surface 24 of the sheathing frame 2 is partially burried by the solderable metal plate 10, so that the metal plate 10 together with the terminals 3, 3 of the capacitor 1 may be soldered when the chip type capacitor is mounted on the printed circuit board.

As shown in FIG. 5, the sheathing frame 2 used for the chip type capacitor of FIG. 4 is connected to a comb-shaped lead frame 14 of a strip substrate 16 from which are extended connections 18, 18 of a flat portion 20 and extensions 21 at predetermined distances.

The lead frame 14 is formed of metal materials such as aluminum, iron, copper or the like or their clad materials and serves as a continuous supplying means with a reel or the like.

The sheathing frame 2 is formed by burying the extensions 21, 21 of the connection 18 of the lead frame 14 into the top surface 24 of the sheathing frame. Any forming means may be available, notwithstanding in this embodiment, an insertion process has been employed. Namely, the connection 18 of the lead frame 14 is partially covered with a mold for injection of synthetic resin so that the extensions 21, 21 of the connection 18 are buried in the sheathing frame 2.

Further, after continuous formation of the sheathing frame 2 by connection with the lead frame 14, the connection 18 of the lead frame 14 is separated from the substrate 16. Thus, the flat portion 20 of the connection 18 of the lead frame 14 is exposed on the top surface of the sheathing frame 2 for binding to provide a metal plate 10 as shown in FIG. 4.

Moreover, the capacitor body 1 is received in the sheathing frame 2 separated from the lead frame 14, and the terminals 3, 3 of the capacitor 1 are bent along the open end of the sheathing frame 2 to the top surface 24 to obtain a chip type capacitor as shown in FIG. 4.

In the manufacturing process of the chip type capacitor according to the embodiment, the sheathing frames 2 are linked by the lead frame 14 to provide a collective unit of the sheathing frames 2 for facilitating a continuous manufacturing or supply of even a delicate sheathing frame 2.

Figure 6:
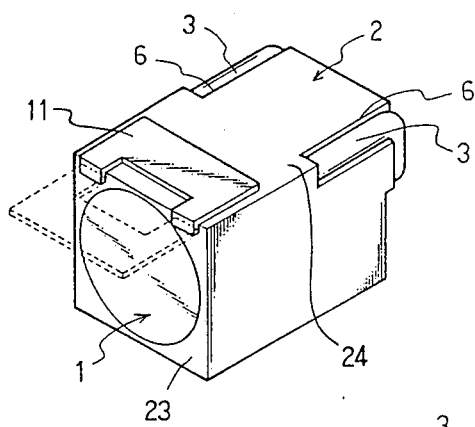
FIG. 6 is a perspective view showing another embodiment of the chip type capacitor according to the invention.
Figure 9:
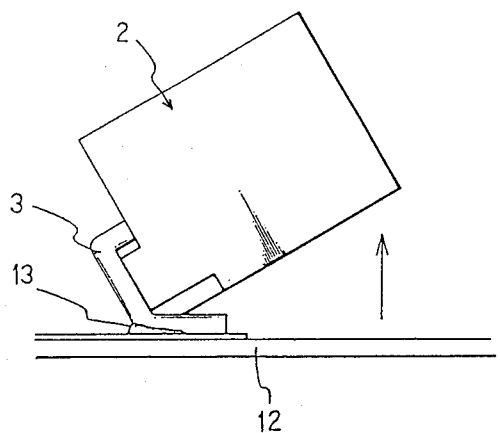
FIG. 9 is a lateral view descriptive of the conventional chip type capacitor actually mounted on a printed circuit board.
Figure 7:
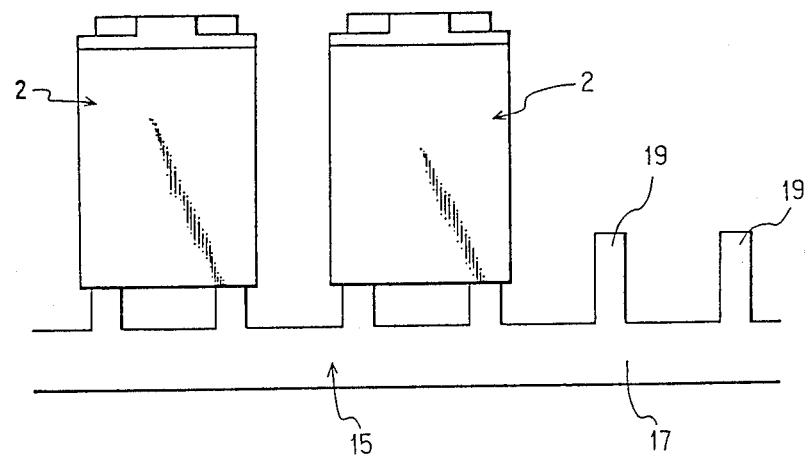
FIGS. 7 and 8 are elevations of the manufacturing process illustrative of the chip type capacitor as shown in FIG. 6.
Figure 8:
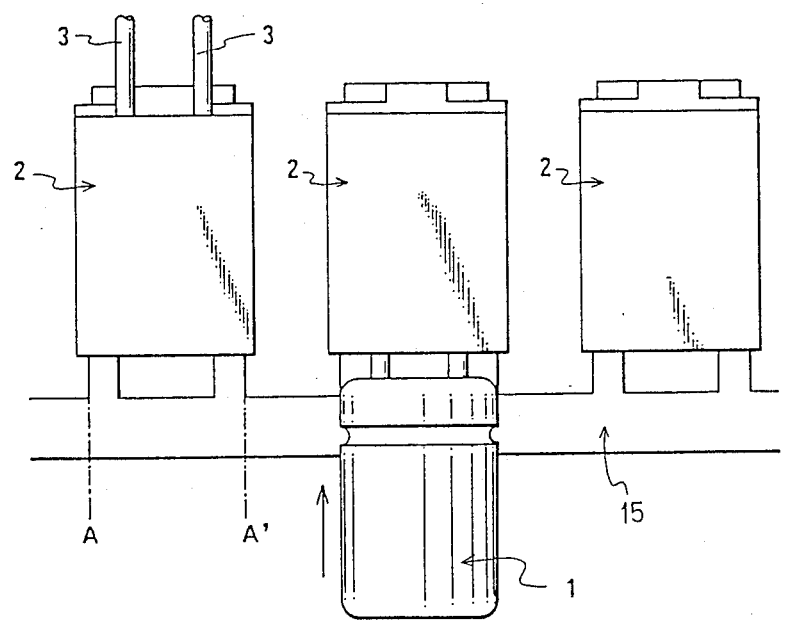

In FIGS. 6 to 8, the sheathing frame 2 for receiving the capacitor 1 is formed with an accommodation space therein and one open end thereof is provided with a projection for partially covering said open end as in the foregoing embodiments. The terminals 3, 3 of the capacitor 1 received in the sheathing frame 2 are bent along the open end to the top surface 24 thereof for reception in the grooves 6, 6.

Further, in an opposite open end 23 confronting the open end formed with the projection is fixed with a metal plate 11 by burying a part thereof in the open end 23. The metal plate 11 is made of solderable metal and bent along the open end 23 of the sheathing frame 2 onto the top surface 24.

In the chip type capacitor according to the invention, at opposite ends of the sheathing frame 2 are arranged solderable metals including the terminals of the capacitor 1 at one end and the solderable metal plate 11 at the opposite end. Soldering of opposite ends when the chip type capacitor is actually mounted on the printed circuit board ensures a tight attachment of the capacitor onto the printed circuit board.

The chip type capacitor according to this embodiment may be manufactured by the process as shown in FIGS. 7 and 8. Namely, as may be seen in FIG. 7, the comb-shaped lead frame 15 in which the connecting portions 19 project from the strip substrate 16 at predetermined distances is connected to the sheathing frame 2 by burying the connection 19 of the lead frame 15 into the open end 23 with an insertion molding process. Namely, the connecting portion 19 of the lead frame 15 is partially covered by a mold for injecting the synthetic resin so that a tip end of the connection 19 is buried in the open end 23 of the sheathing frame 2.

Furthermore, after the continuous formation of the sheathing frame 2 onto the lead frame 15, a collective unit of the sheathing frames 2 associated with the lead frame 15 is transferred together without separation of each sheathing frame as shown in FIG. 8 and supplied to the receiving process of the sheathing frame 2 into the receiving space.

Into individual sheathing frame 2 supplied as a collective unit is sequentially received the capacitor as shown in FIG. 8. In this operation, since the directions of the sheathing frame 2 are all consolidated, the directions of the capacitors 1 to be received in the sheathing frame 2 or polarites of the terminals 3, 3 are controlled to be constant so as to avoid the reverse-mounting of the capacitor 1.

Then the lead frame 15 is cut off along the dotted lines A—A' shown in FIG. 8 to separate the sheathing frame 2 from the lead frame 15. Further, a part of the lead frame 15 remaining in the separated sheathing frame 2 is bent along the opened end 23 and the top surface of the sheathing frame 2 for connection to the top surface 23 of the sheathing frame 2 as shown in FIG. 6.

On the other hand, the terminals 3, 3 extending from the other open end of the sheathing frame 2 are bent along the open end and the top surface 24 of the sheathing frame 2 for reception into the grooves 6, 6 of the sheathing frame 2 to obtain the chip type capacitor.

In this embodiment, the bending process of the terminals 3, 3 is performed after separation of the sheathing frame 2 from the lead frame 15, notwithstanding that bending before separation of the sheathing frame 2 from the lead frame 15 is possible. In this case, a plurality of the capacitors may be subjected to the simultaneous bending processes of the terminals 3, 3 for realization of a more efficient manufacturing process.

As hereinbefore fully described, the present invention is characterized in that the capacitor is received in the sheathing frame having the receiving space compatible with the external size of the capacitor, the terminals derived from the same open end of the capacitor are bent along the open end and the top surface of the sheathing frame and that the solderable metal layer is arranged in a part of the top surface thereof, so that when the terminals connected to the printed circuit board as well as the metal layer are soldered, the chip type capacitor according to the invention is fixed to the printed circuit board at opposite ends of the top surface of the sheathing frame, thus any lifting up or separation of the chip type capacitor actually mounted on the printed circuit board by vibration, soldering heat, warping of the terminals or the like may be avoided. Also, the resistance to mechanical stress when the chip type capacitor is actually mounted on the printed circuit board is enchanced with proper mounting conditions and increased reliability.

In an alternative process, the solderable conductive paste is applied to the top surface not contacting the terminals and a part of the open end thereof, or the solderable metal piece is bound or the solderable metal layer is formed by means of an evaporation or a non-electrolytic plating, so that an extremely thin solderable metal layer is formed on a part of the top surface of the sheathing frame. Thus, good mounting of the chip type capacitor according to the invention may be maintained without spoiling any stability thereof.

In another process, the solderable metal plate partially having extensions is mounted on the top surface of the sheathing frame by burying the extensions thereinto or the extensions of the metal plate are buried in the open end of the sheathing frame while the metal plate is bent along the top surface of the sheathing frame, dispensing with binding of the metal piece so that the capacitor at its opposite ends may be soldered without consideration of the heat fluctuation to be caused by a bonding agent or the like.

In the manufacturing process of the capacitor according to the invention, the lead frame of the strip substrate having connections with extensions are associated with the sheathing frame by burying the extensions of the connections thereinto and then the sheathing frame is separated from the lead frame for the continuous production and supply of the sheathing frame.

Further, since the metal plate is integrally formed on the end of the sheathing frame, a tight connection is obtained with an enhanced reliability.

In another manufacturing process of the capacitor, the capacitor is accommodated in the receiving space of the sheathing frame associated with the connection of the lead frame before the sheathing frame is separated from the lead frame, so that the capacitor body may be continuously received in the sheathing frame with no need for a parts feeder or the like performing a positive transfer of the sheathing frame to the receiving step of the capacitor body at a higher speed.

In the receiving process of the capacitor body into the sheathing frame, individual sheathing frames linked by the lead frame as a collective unit are supplied in the same directions. Thus, when the capacitor is received in the sheathing frame, the directions of the terminals of the capacitor or polarities thereof are controlled to avoid the reverse-mounting of the capacitor to the sheathing frame with a simplified process but an enhanced reliability.

Although the invention has been described hereinabove with its preferred embodiments, many variations and modifications may be made while keeping the advantages as shown hereinabove but without departing from the scope and spirit of the invention.

What is claimed is:

1. A chip-type capacitor disposed in a sheathing frame, a pair of terminals extending from one end face of said capacitor, said terminals being both bent over onto the same underside of the sheathing frame, and a metal layer on said underside spaced from said terminals, whereby both said terminals and said metal layer are adapted to be soldered onto a same surface of a printed circuit board.

2. A chip-type capacitor as claimed in claim 1, said metal layer being a solderable metal sheet secured to said sheathing frame.

3. A chip-type capacitor as claimed in claim 1, wherein said metal layer is a solderable conductive paste.

4. A chip-type capacitor as claimed in claim 1, wherein said metal layer is applied to said underside by evaporation.

5. A chip-type capacitor as claimed in claim 1, in which said metal layer is applied to said underside by non-electrolytic plating.

6. A chip-type capacitor as claimed in claim 1, said metal layer being in the form of a metal piece having portions embedded in said sheathing frame.

7. A chip-type capacitor as claimed in claim 6, wherein said portions are bent-up edge portions of said metal piece.

8. A process for manufacturing a chip-type capacitor disposed in a sheathing frame, comprising providing a strip metal frame having thereon a plurality of extensions, burying at least one said extension partially in a said sheathing frame to provide a solderable metal layer on said extension, and then separating the sheathing frame from the metal frame leaving the extension partially buried in the sheathing frame.

9. A process as claimed in claim 8, and disposing said capacitor within the sheathing frame prior to separation of the sheathing frame from said metal frame.

10. A process as claimed in claim 8, and bending an exposed portion of said partially buried extension over into contact with a flat surface of said sheathing frame.

* * * * *